510-522 SR

2/24/87 XR 4,646,104

United States Patent [19]

Braun

[11] Patent Number: 4,646,104

[45] **Date of Patent: * Feb. 24, 1987**

[54] FLUID JET PRINT HEAD

[75] Inventor: Hilarion Braun, Xenia, Ohio

[73] Assignee: Eastman Kodak Company, Rochester, N.Y.

[ * ] Notice: The portion of the term of this patent subsequent to Apr. 15, 2003 has been disclaimed.

[21] Appl. No.: 777,102

[22] Filed: Sep. 17, 1985

Related U.S. Application Data

[63] Continuation-in-part of Ser. No. 390,105, Jun. 21, 1982, abandoned, and a continuation-in-part of Ser. No. 771,467, Aug. 30, 1985, Pat. No. 4,583,101, which is a continuation of Ser. No. 453,082, Dec. 27, 1982, abandoned.

[51] Int. Cl.[4] ..................... G01D 15/18; H01L 41/08

[52] U.S. Cl. ....................................... 346/1.1; 346/75; 346/140 R; 310/322; 310/323; 310/325

[58] Field of Search ...................... 346/75, 140 R, 1.1; 310/322, 323, 325

[56] References Cited

U.S. PATENT DOCUMENTS

| | | | |
|---|---|---|---|
| 2,514,080 | 7/1950 | Mason | 73/596 |
| 2,573,168 | 10/1951 | Mason et al. | 74/155 |
| 2,998,535 | 8/1961 | Church et al. | 310/325 |
| 3,113,225 | 12/1963 | Kleesattel et al. | 310/26 |
| 3,586,907 | 6/1971 | Beam et al. | 361/228 |
| 3,667,678 | 6/1972 | Haskell | 239/102 |
| 3,683,396 | 8/1972 | Keur et al. | 346/1.1 |
| 3,701,476 | 10/1972 | Houser | 239/102 |
| 3,701,998 | 10/1972 | Mathis | 346/75 |
| 3,739,393 | 6/1973 | Lyon et al. | 346/1.1 |
| 3,815,129 | 6/1974 | Sweany | 340/388 |
| 3,821,747 | 6/1974 | Mason | 346/62 |
| 3,850,717 | 11/1974 | Keur et al. | 156/86 |
| 3,950,760 | 4/1976 | Rauch et al. | 346/140 |
| 3,972,474 | 8/1976 | Keur | 239/102 |
| 4,095,232 | 6/1978 | Cha | 346/75 |
| 4,122,365 | 10/1978 | Stephens | 310/324 |
| 4,188,635 | 2/1980 | Giordano et al. | 346/75 |
| 4,198,643 | 4/1980 | Cha et al. | 346/75 |
| 4,228,440 | 10/1980 | Horike et al. | 346/75 |
| 4,231,047 | 10/1980 | Iwasaki et al. | 346/75 |
| 4,233,610 | 11/1980 | Fischbeck et al. | 346/140 |
| 4,240,081 | 12/1980 | Devitt | 346/75 |
| 4,243,995 | 1/1981 | Wright et al. | 346/140 |
| 4,245,227 | 1/1981 | Krause | 346/75 |
| 4,282,532 | 8/1981 | Markham | 346/75 |
| 4,290,074 | 9/1981 | Royer | 346/75 |
| 4,308,546 | 12/1981 | Halasz | 346/140 |
| 4,338,611 | 7/1982 | Eida et al. | 346/75 |
| 4,366,490 | 12/1982 | DeBonte et al. | 346/140 |
| 4,418,353 | 11/1983 | Thomas | 346/140 |
| 4,422,082 | 12/1983 | Louzil | 346/75 |
| 4,583,101 | 4/1986 | Braun | 346/75 |

FOREIGN PATENT DOCUMENTS

| | | | |
|---|---|---|---|
| 0097413 | 1/1984 | European Pat. Off. | 400/126 |
| 0116786 | 8/1984 | European Pat. Off. | 400/126 |
| 1293980 | 10/1972 | United Kingdom | 400/126 |
| 1422388 | 1/1976 | United Kingdom | 400/126 |

OTHER PUBLICATIONS

*Ultrasonics*, Carlin, 1960, pp. 108 and 116, Patent Abstracts of Japan, vol. 5, No. 174 (M-96) [846], 11/10/81; & JP-A-56, 101869 (Ricoh K. K.).

*Primary Examiner*—E. A. Goldberg
*Assistant Examiner*—Gerald E. Preston
*Attorney, Agent, or Firm*—Biebel, French & Nauman

[57] ABSTRACT

A stimulation arrangement for a fluid jet printer. A pair of piezoelectric crystals are mounted on opposing surfaces of a high acoustic Q solid member and are excited for periodic lengthening at the frequency of desired stimulation. This creates shear waves in the surface of the high Q member. The high Q member is configured in such a fashion that it transforms the shear waves into stationary compression waves which drive an orifice plate and thereby stimulate fluid filaments being generated by the jet printer. The high Q member may be a rod-like stimulator supported for localized contact against a filament forming orifice plate or it may comprise support structure for the orifice plate.

39 Claims, 13 Drawing Figures

FLUID JET PRINT HEAD

This application is a continuation-in-part of application Ser. No. 06/390,105, filed June 21, 1982 abandoned. It is also a continuation-in-part of Ser. No. 771,467 filed Aug. 30, 1985, U.S. Pat. No. 4,583,101, which is a continuation of Ser. No. 06/453,082, filed Dec. 27, 1982, and now abandoned.

BACKGROUND OF THE INVENTION

The present invention relates to the field of jet drop printing and more particularly to an improved fluid jet print head and a method of operation therefor.

Jet drop printers operate by generating streams of small drops of ink and controlling the deposit of the drops on a print receiving medium. Typically, the drops are electrically charged and then deflected by an electrical field. The drops are formed from fluid filaments which emerge from small orifices. The orifices may be formed in an orifice plate which communicate with a fluid reservoir in which fluid is maintained under pressure. Each fluid filament tends to break apart at its tip to form a stream of drops. In order to produce accurate printing it is necessary that the drops be generated at accurately timed intervals. This is accomplished by a process known as "stimulation".

One prior art approach vibrates the entire print head, including the ink manifold structure and the orifice plate structure, together. This is shown in Beam et al U.S. Pat. No. 3,586,907. Such an arrangement necessarily fatigues the print head mounting structure, since the mounting structure experiences the same vibrations as are applied to the manifold and the orifice plate. Further, the amplitude and phase of the vibratory motion are difficult to control at the frequencies commonly used for jet drop printer operation.

Another prior art stimulation technique, as shown in Lyon et al U.S. Pat. No. 3,739,393, provides the fluid orifices in a relatively thin, flexible orifice plate. The orifice plate is stimulated by causing a series of bending waves to travel therealong. This technique, known as traveling wave stimulation, results in substantially uniform drop size and spacing, but the timing of break up of the fluid filaments varies along the length of the orifice plate.

Other prior art approaches have attempted to stimulate the filaments in a common phase by exciting coplanar movement of the orifices in the orifice plate, a typical example is disclosed in Cha U.S. Pat. No. 4,095,232. Using the technique disclosed in this patent, stimulators mounted in the upper portion of a fluid reservoir generate pressure waves which are transmitted downward through the fluid. Each stimulator includes a pair of piezoelectric crystals which vibrate in phase and which are mounted on opposite sides of a mounting plate which is coincident with a nodal plane. A reaction mass is positioned at the end of each stimulator opposite the stimulation member. The reaction mass ensures that the nodal plane is properly positioned.

In British Patent Specification No. 1,293,980, and Cha et al U.S. Pat. No. 4,198,643, print heads are disclosed in which a pair of piezoelectric crystals are bonded to opposite sides of a support plate. A print head manifold structure is bonded to one of the piezoelectric crystals and a counterbalance is bonded to the other of the crystals. The weight of the counterbalance is selected so as to offset the weight of the manifold structure. By this balanced arrangement, the support plate is placed in a nodal plane when the two piezoelectric transducers are energized in synchronism.

Finally, in Keur U.S. Pat. No. 3,972,474, an ink drop writing system is shown in which a vibrating nozzle is used to produce a stream of drops. The length of the nozzle is selected so that its mechanical resonant frequency is much higher than the frequency at which it is driven. The nozzle, configured as a tube, is surrounded by a piezoelectric ring which, when electrically driven, provides radial contraction and expansion of the tube.

Generally speaking, the prior art stimulation systems have employed piezoelectric crystals incorporated into mechanical arrangements of complex acoustical design. Each such arrangement has had to be individually tailored for resonant operation at the design frequency within its specifically associated print head. Such tailoring has required careful mechanical adjustment and/or trial and error selection of component parts. This has "tuned" the stimulation system for operation within an extremely narrow range of operating frequencies. For operation outside this range the performance is extremely degraded.

In some applications it is desirable to adjust the frequency of the stimulation driving signal. A typical example is in precision printing of high resolution graphics. In such printing there are unavoidable variations in the transport speed of the substrate, and these variations tend to produce drop positional placement errors. This can be corrected by adjusting the stimulation drive, as shown for instance in Van Brimer et al U.S. Pat. No. 3,588,906. This results in stimulation at a frequency which deviates from the nominal design frequency. Such deviation cannot be accomodated satisfactorily by systems of the above described types.

Thus it is seen that there is a need for an improved and simplified apparatus for effecting fluid jet stimulation and for accommodating adjustments in the frequency of the stimulation.

SUMMARY OF THE INVENTION

The present invention provides constructions for simpler and more effective stimulation of fluid jet printing streams. Moreover the invention is applicable to multi-orifice print head systems of the type wherein an orifice plate is excited by traveling bending waves as well as those wherein the orifice plate is excited for movement with its orifices coplanar. In either case the system may be provided with stimulation means comprising a high acoustic Q solid member having a major dimension substantially equal to an integral number of half wavelengths of vibration at the stimulation frequency and two other minor dimensions each substantially shorter than a half of such a wavelength. A pair of elongated strips of piezoelectric material are bonded to opposite surfaces of the metallic member and driven so as to elongate periodically at the stimulation frequency in a direction parallel to the major dimension of the high Q member. This induces corresponding shear stresses in the surfaces of the metallic member, and those shear stresses cause the desired vibration of the orifice plate.

For application to traveling wave stimulation the metallic member may comprise a rod-like structure supported for localized contact against the orifice plate. For coplanar orifice movement the high Q member may comprise support structure integrally associated with the print head body.

In one aspect the present invention provides an improved fluid jet print head comprising an elongated print head body, the length or major dimension of the body between first and second ends thereof being substantially greater than its other minor dimensions. The body defines a fluid receiving reservoir in its first end and at least one orifice communicating with the fluid receiving reservoir. Fluid is supplied to the reservoir under pressure by appropriate means such that it emerges from the reservoir to form a fluid stream. A transducer means is mounted on the exterior of the body and extends along the body in the direction of elongation toward both the first and second ends of the body. The transducer means is responsive to a stimulation driving signal for changing dimension in the direction of elongation of the body, thereby causing mechanical vibration of the body and break up of the fluid stream into a stream of drops. The major dimension of the print head is substantially equal to an integral number of half wavelengths of head vibration at the frequency of the stimulation driving signal.

The transducer means comprises a pair of elongated strips of piezoelectric material bonded to opposite sides of the body and extending in the direction of elongation. The piezoelectric strips induce alternating shear stresses in the surfaces of the elongated print head body in the direction of elongation of the body. These surface shear stresses are converted into compression waves which travel in the direction of elongation and produce longitudinal vibration of the print head body at the stimulation driving frequency.

The transducer means further comprises means for electrically connecting the pair of transducers in parallel, whereby the transducers operate in phase so as to produce vibration which is in a direction substantially parallel to the direction of elongation of the elongated print head body. A support means for the print head engages the print head body intermediate and substantially equidistant from its first and second ends.

Alternatively, the transducer means may comprise means for electrically connecting the transducers so that they operate out of phase, thus producing flexure waves. The support means for the print head engages the print head body a distance from each end of the body approximatey equal to 23 percent of the overall length of the body.

The print head is provided with a fluid receiving reservoir and an orifice plate having a plurality of orifices communicating with the reservoir. The orifice plate may be mounted upon a face of the print head extending perpendicular to the major dimension of the head or, alternatively, upon a face extending parallel to the major dimension. Accordingly, the printing jets may be directed either parallel or perpendicular to the major dimension of the print head.

The fluid jet print head may further include means for applying an electrical driving signal of a frequency substantially equal to $f_o=C/2L$, where L is the dimension of the body in the direction of elongation, and C is the speed of sound through the body. In this case the fluid jet print head is driven at a frequency approximating its mechanical resonant frequency.

For flexure wave vibration, the transducers are driven at a frequency $F_o \cong \alpha Ca/L^2$, where a is the transverse thickness of the print head body and $\alpha \cong 1$ in MKS units. In this case, two nodal mounting axes are established a distance equal to approximately 0.23 of the length of the print head body, centered between the transducers.

The method for stimulating the break up of a fluid stream emanating from at least one orifice communicating with the fuid reservoir in a half wavelength fluid jet print head includes the steps of:

(a) providing an elongated print head which defines the reservoir and orifice at one end thereof;

(b) applying fluid under pressure to the reservoir so as to produce fluid flow through the orifice;

(c) supporting the print head at points in a plane substantially equidistant from the ends of the elongated print head and normal to the direction of elongation of the print head; and (d) alternately elongating and contracting the print head substantially at the resonant frequency of the print head, whereby the print head is supported in at least one nodal plane and the stream is effectively stimulated to break up into drops.

The resonant frequency of the print head may be substantially equal to the resonant frequency of the fluid stream. The print head may be elongated and contracted by means of piezoelectric transducers bonded to its exterior.

The stream may also be stimulated by operating the transducers out of phase, thereby causing flexure of the print head. In this stimulation mode, the print head is mounted at points spaced from the ends by a distance approximately equal to 23 percent of the length of the print head when operated in its fundamental bending mode.

In another aspect the invention provides improved traveling wave stimulation through use of an elongated stimulator member having a length which is substantially greater than its other dimensions and a pair of transducer means mounted on opposite exterior sides of the stimulator member. The transducer means extend in opposing relation a substantial distance in the direction of elongation of the stimulation member and are responsive to an electrical driving signal for applying surface shearing stresses to the stimulation member in the direction of elongation.

In yet another aspect the present invention provides improved constructions for detecting the frequency and amplitude of print head stimulation for use in print head control.

Accordingly, it is an object of the present invention to provide improved apparatus and method for fluid jet stimulation wherein a pair of transducers are mounted on opposite surfaces of a metallic member and are excited to produce surface shearing stresses and consequential vibration of an orifice plate through which a fluid jet is being directed.

Other objects and advantages of the invention will be apparent from the following description, the accompanying drawings and the appended claims.

DETAILED DESCRIPTION OF THE PREFERRED EMBODIMENTS

Figure 1:
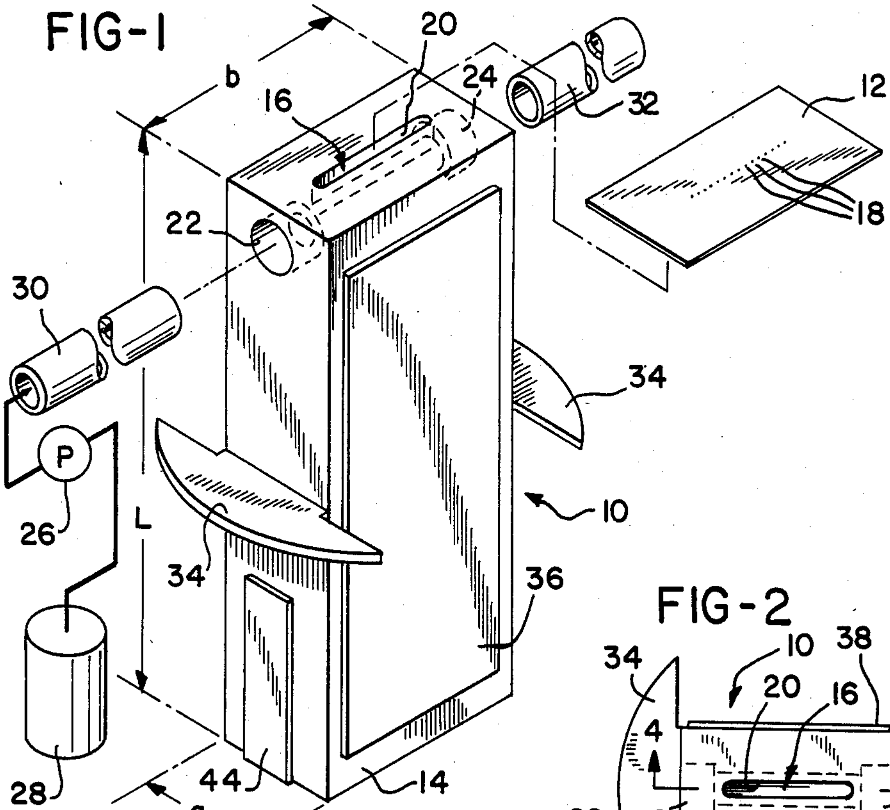
FIG. 1 is an exploded view, illustrating a first embodiment of the fluid jet print head of the present invention.
Figure 2:
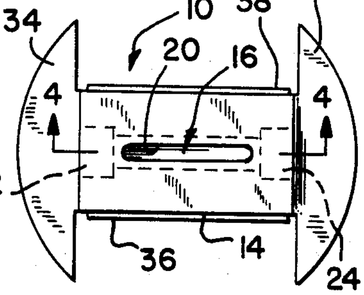
FIG. 2 is a plan view of the print head of FIG. 1, with the orifice plate removed.
Figure 3:
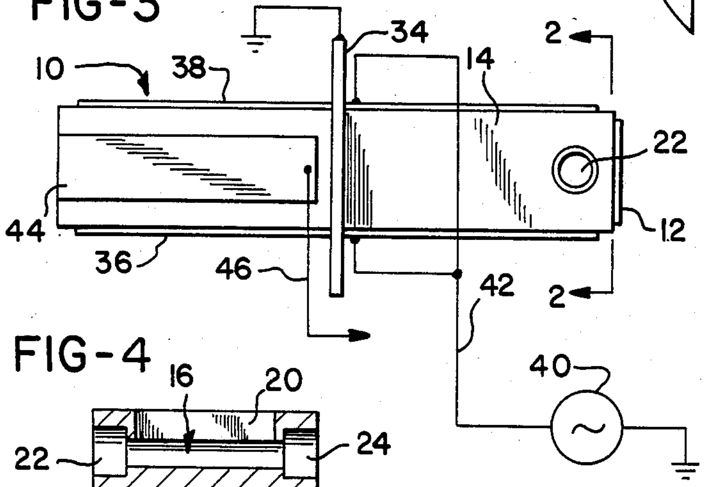
FIG. 3 is a side view of the print head of FIG. 1 with the electrical drive circuitry illustrated.
Figure 4:
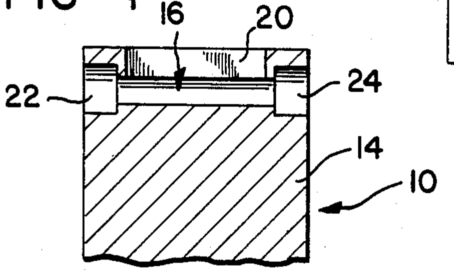
FIG. 4 is an enlarged partial sectional view, taken generally along line 4—4 in FIG. 2.

A first embodiment of the print head of the present invention is shown in FIGS. 1–4. The print head generally includes an elongated print head body 10, having a major dimension or length, L, which is substantially greater than its other dimensions a and b. The body 10 includes an orifice plate 12 bonded to a block of high acoustic Q solid material 14. The body 10 defines a fluid receiving reservoir 16 in its first end, and at least one and preferably a number of orifices 18 which are arranged in a row across orifice plate 12. Block 14 is preferably manufactured from stainless steel, but other high acoustic Q solid materials such as glass or ceramic may be used. Block 14 defines a slot 20 which, in conjunction with orifice plate 12 defines the reservoir 16. The block 14 further defines a fluid supply opening 22 and a fluid outlet opening 24, both of which communicate with the slot 20.

The print head further includes means for supplying fluid to the reservoir 16 under pressure such that fluid emerges from the orifices 18 as fluid filaments which then break up into streams of drops traveling in a direction parallel to the major dimension of the body 10. A pump 26 receives fluid from a tank 28 and delivers it, via fluid conduit line 30, to the reservoir 16. A conduit 32 is connected to fluid outlet 24 such that fluid may be removed from the reservoir 16 at shut down of the print head or during cross-flushing of the reservoir 16. As will become apparent, the end of the print head to which conduits 30 and 32 are attached, as well as the opposite end of the print head, is subjected to mechanical vibrations which cause the fluid filaments to break up into streams of drops of uniform size and spacing. The conduits 30 and 32 are selected from among a number of materials, such as a polymeric material, which have a vibrational impedance substantially different from that of the stainless steel block 14. As a consequence, power loss through the conduits 30 and 32 and the resulting damping of the vibrations are minimized. The ink conduits may also be machined to the nodal plane, where vibrations are minimal and can then be connected to tubes having less critical acoustic properties.

The print head further includes support means, such as mounting flanges 34. Flanges 34 are relatively thin and are integrally formed with the block 14. The flanges 34 extend from opposite sides of the elongated print head body 10 and are substantially equidistant from the first and second ends of the body. As a result, the flanges may be used to support the body 10 in a nodal plane. The flanges 34 are therefore not subjected to substantial vibration.

The print head further comprises a transducer means, including thin piezoelectric transducers 36 and 38. The transducers are bonded to the exterior of the body of block 14 and extend a substantial distance along the body in the direction of elongation thereof, from adjacent the support means toward both the first and second ends of the body. The transducers 36 and 38 respond to an electrical driving signal, provided by power supply 40 on line 42, by changing dimension, thereby applying shear stresses to the surfaces of the print head body. Due to the geometry of the print head body these shear stresses are converted into compression waves which travel along the body in a direction parallel to the direction of extent of the major axis. The resulting compression waves stimulate the fluid streams to break up into streams of drops.

The piezoelectric transducers 36 and 38 have electrically conductive coatings on their outer surfaces, that is the surfaces away from the print head block 14, which define a first electrode for each such transducer. The metallic print head block 14 typically grounded, provides the second electrode for each of the transducers. The piezoelectric transducers are selected such that when driven by an A.C. drive signal, they alternately expand and contract in the direction of elongation of the print head. As may be seen in FIG. 3, transducers 36 and 38 are electrically connected in parallel. The transducers are oriented such that a driving signal on line 42 causes them to elongate and contract in unison.

If desired, an additional piezoelectric transducer 44 may be bonded to one of the narrower sides of the print head to provide an electrical output potential on line 46 which fluctuates in correspondence with the elongation and contraction of the print head block 14. The amplitude of the signal on line 46 is proportional to the amplitude of the mechanical vibration of the block 14.

The mechanism by which the first embodiment of the print head of the present invention functions may be described as follows. The elongated print head body is somewhat analogous to an ordinary helical spring. If such a spring is compressed and then quickly released, it will oscillate about its center at a frequency $f_o$, called its fundamental longitudinal resonant frequency. In this condition, both ends of the spring move toward and away from the center of the spring, while the center remains at rest. Therefore, if one fixes the center of the spring and repeats the above described operation, the spring will oscillate in the same manner at the frequency $f_o$.

The steel block 14 which forms a part of the print head body can be considered to be a very stiff spring. If properly mechanically stimulated, it may therefore be held at its center, as by flanges 34, while both ends of the block 14 alternately move toward and away from the center. Since the center of the block lies in a nodal plane, the flanges 34 are not subjected to substantial vibration and the support for the print head does not interfere with its operation. As the end of the print head body 10 which defines the fluid receiving reservoir 16 is vibrated, the vibrations are transmitted to the fluid filaments which emerge from the orifices 16, thus causing substantially simultaneous uniform drop break up. Note that the reservoir 16 is small in relation to the overall size of the block 14 and is centered in the end of the block. As a consequence, the reservoir 16 does not interfere significantly with the vibration of the block 14, nor affect the resonant frequency of the print head substantially. The homogeneous nature of the solid block assures uniform amplitude of vibration along the ends whereby synchronous breakup of relatively long, dense ink jet arrays is possible.

The fundamental resonant frequency of the block 14 can generally be said to be given by $$f_o = C/2L = \sqrt{E/\rho}\ /2L$$

where C is the speed of sound through the print head block 14 material, L is the length of the print head body in the direction of elongation, E is the modulus of elasticity of the material forming block 14 and is the density of the material forming the block 14. Preferably the print head is designed to operate at or near its resonant frequency, and this frequency, in turn, is selected within an appropriate fluid jet stimulation frequency range, e.g., 50 KHz to 100 KHz; that is, the print head block is constructed of a material and with dimensions such that its fundamental longitudinal mode resonant frequency is approximately equal to the nominal jet droplet stimulation frequency for the printing system. The homogeneous nature of the solid block assures uniform amplitude of vibration along the ends whereby synchronous breakup of relatively long dense ink jet arrays is possible. As above described, print head block 114 has a length L which is equal to a half wavelength, where a wavelength is a distance determined by the equation:

$$\lambda = \frac{1}{f_o} \sqrt{E/\rho}$$

In general L may have a value substantially equal to any integral number of half wavelengths. Thus:

$$L = \frac{n}{2f_o} \sqrt{E/\rho}$$

By providing a pair of piezoelectric transducers 36 and 38 on opposite sides of the block 14, the block 14 is elongated and contracted without the flexure oscillations which would otherwise result if only one such piezoelectric transducer were utilized. Additionally, the use of two piezoelectric transducers allows for a higher power input into the print head for a given voltage and, consequently, for a higher maximum power input into the print head, since only a limited voltage differential may be placed across a piezoelectric transducer without break down of the transducer.

As is well know, E, $\rho$ and L are temperature dependent and, as a consequence, the resonant frequency of the print head varies with changes in temperature. The variation $\Delta f$ in $f_o$ for a temperature change of $\Delta T$, at or near room temperature, is given by $\Delta f = \Delta f_o k \Delta T/2$, where k is approximately $4\times10^{-4}$/C.° for stainless steel.

Figure 5:
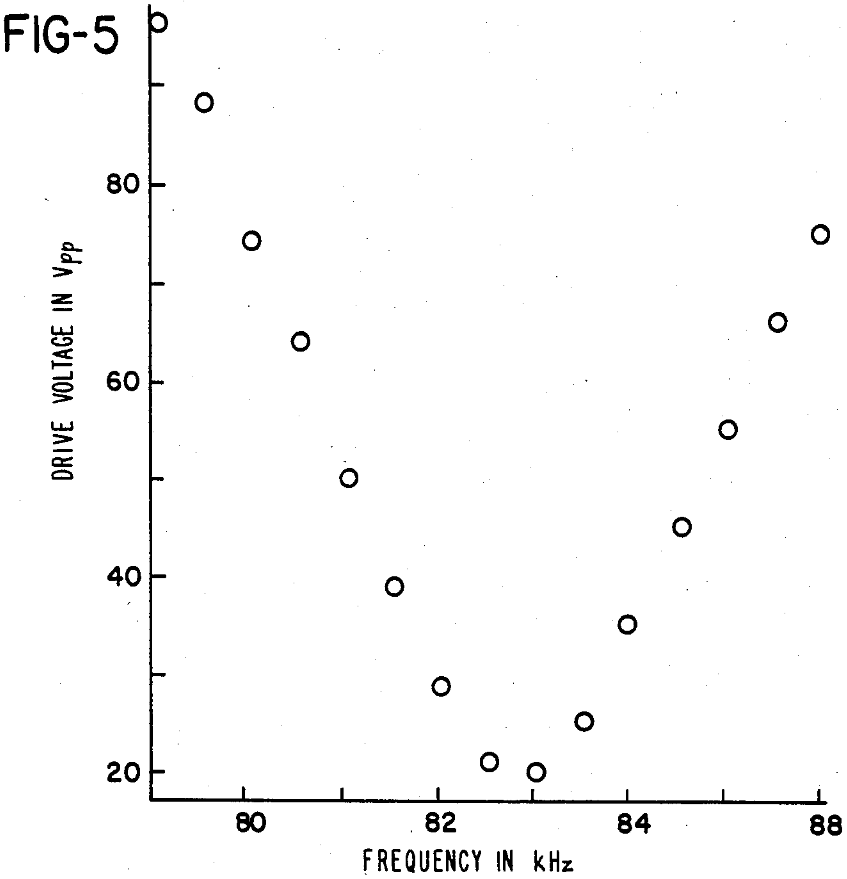
FIG. 5 is a graph, useful in explaining the operation of the print head of the present invention.

When the dimensions a and b are small as compared to L, the print head can be driven at a frequency off resonance. FIG. 5 illustrates the changes in the driving voltage applied to the transducers which are required in order to drive a single jet print head for a constant nominal filament length of $16.5\times10^{-3}$ in. In general, the nominal filament length is a function of both the driving voltage and the driving frequency. At any given driving frequency the nominal filament length decreases with increases in the driving voltage.

From FIG. 5, it is clear that at resonance, 83 KHz, the print head requires a drive voltage of approximately 20 volts peak-to-peak. When driven by an oscillator at a frequency to either side of the resonant frequency, the driving voltage must be increased substantially in order to maintain the filament length at $16.5\times10^{-3}$ in. On either side of the resonant frequency, the voltage required rises approximately linearly with frequency. There is, however, a maximum voltage which may be applied to the piezoelectric transducers and, so long as the maximum voltage is not exceeded, the transducers may be driven on the positive slope portion of the curve of FIG. 5, or the negative slope portion of the curve. Assuming that the resonant frequency remains constant, the driving frequency may be varied in synchronization with fluctuations in speed of the print receiving medium upon which drops from the print head are to be deposited, thereby compensating for such fluctuations. In such an instance, the frequency of the drive signal is monitored, however, and the voltage of the drive signal adjusted accordingly in order to compensate for the frequency shift and thereby maintain the desired fluid filament length.

Figure 6:
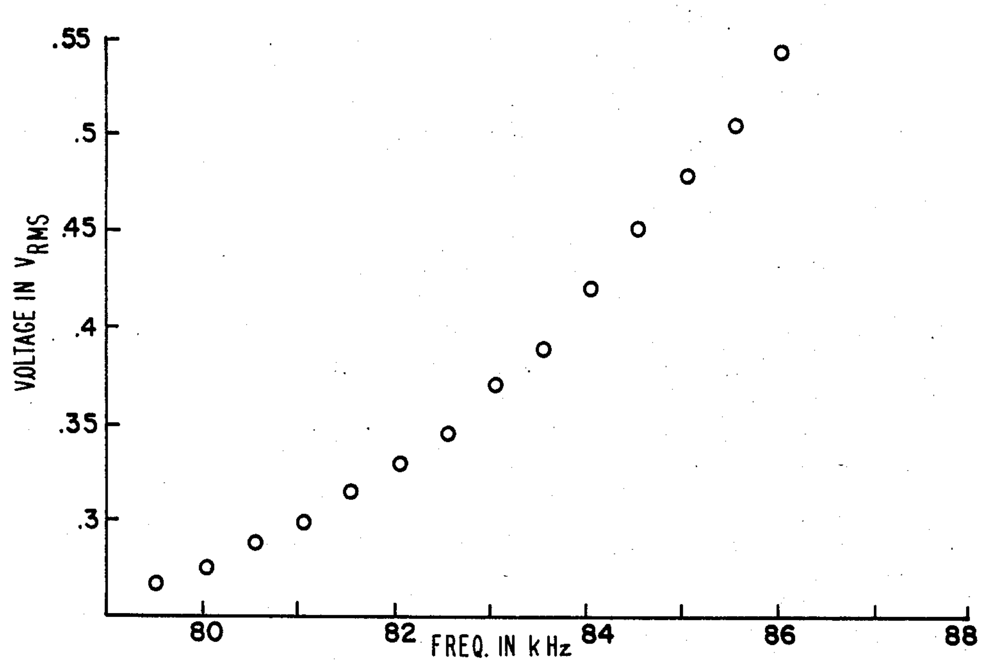
FIG. 6 is a second graph, useful in explaining operation of the print head of the present invention.

If desired, the additional piezoelectric transducer 44 may be utilized to monitor the frequency of the drive signal and amplitude of vibration of the print head and provide a corresponding feedback signal. This feedback signal is plotted in FIG. 6 as a function of the frequency of the driving signal for the maintenance of a single jet print head nominal fluid filament of a length equal to $16.5\times10^{-3}$ in., and a diameter of approximately $1\times10^{-3}$ in. Assuming no change in the resonant frequency of the print head or the jet, a fluid filament of a desired length can be maintained by monitoring the output voltage and frequency on line 46 and adjusting the level of the driving signal as needed to maintain the output voltage on line 46 at a reference voltage level specified by the curve of FIG. 6.

In a typical application it may be desirable to apply in the order of about 2 percent frequency adjustment to the stimulation driving signal. In order to accommodate this, the minor dimensions of the print head preferably should be less than about one-fourth the major dimension, and the major dimension should be substantially equal to an integral number of half wavelengths at the driving frequency.

It will be appreciated that numerous variations may be made in the disclosed print head within the scope of the present invention. For example, flanges 34 may be deleted. Another arrangement, such as support screws may be provided for attaching the print head body to appropriate support structure, as long as the point or points of attachment lie substantially in the nodal plane intermediate the ends of print head body 10. Alternately ink supply tubes may serve as support members when connected to fluid conduits internal to the block extending from the ink reservoir to the nodal plane.

Figure 7:
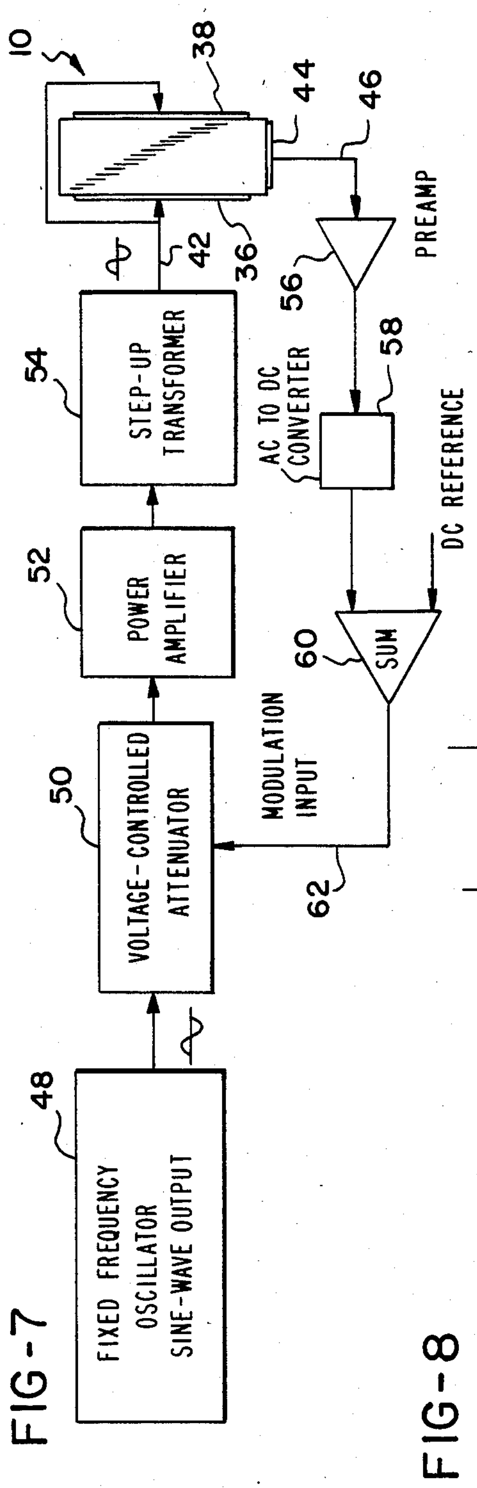
FIG. 7 is a schematic diagram illustrating driving circuitry for the fluid print head.

Reference is made to FIG. 7 which illustrates a circuit which may be used for supplying a fixed frequency stimulation driving signal. The output of a fixed frequency oscillator 48 is supplied to transducers 36 and 38 via a voltage controlled attenuator circuit 50, a power amplifier 52 and a step-up transformer 54. The output from transducer 44 on line 46 is used to control the amount of attenuation provided by circuit 50. The signal on line 46 is amplified by amplifier 56, converted to a D.C. signal by converter 58, and then compared to a selected reference signal by summing circuit 60 to produce a signal on line 62 which controls the attenuation provided by circuit 50. By this feedback arrangement, the amplitude of the mechanical vibration of the print head is precisely controlled. For variable frequency stimulation a somewhat different stimulation driving circuit may be employed.

Figure 8:
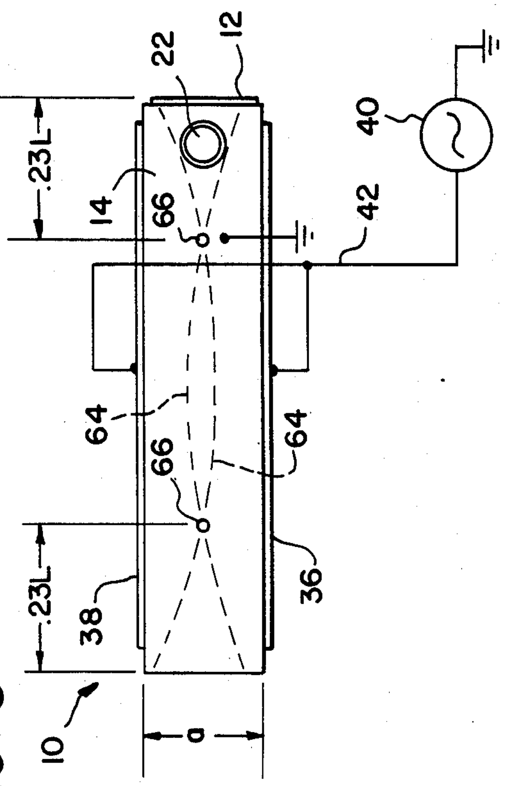
FIG. 8 is a side view of a second embodiment of the fuid jet print head of the present invention.

FIG. 8 is a side view illustrating a second embodiment of the present invention, with elements corresponding to the print head of FIG. 1 being labeled with identical reference numerals. In this embodiment the transducers 36 and 38 are oriented on the print head body such that a positive driving signal on line 42 causes one of the transducers to elongate and the other transducer to contract, while a negative driving signal has the opposite effect. As a consequence, as an A.C. driving signal is supplied to line 42, the print head is caused to vibrate in its first flexure mode. This vibrational mode is illustrated in FIG. 8 by medial lines 64 which, although greatly exaggerated in flexure for purposes of clarity, indicate the extent of movement of the center of the print head body 14. It should be noted that lines 64 cross at points which are approximately 0.23L inward from each end of the print head body, thus indicating nodal points. Mounting holes 66 are drilled into body 14 at the nodal points and a second corresponding pair of mounting holes are drilled into the opposite side of the print head body. By providing mounting pins which extend into holes 66, pivot supports are provided which do not interfere with flexure of the print head.

This flexure mode may be excited by driving the transducers at a frequency $$f_o \cong \alpha Ca/L^2,$$

where $\alpha$ is approximately 1 in MKS units.

This is a simplification of the resonant frequency equation $$f_o \cong 9\pi CK/8L^2,$$

where K is the radius of gyration, which for the print head illustrated equals a/2.

Figure 9:
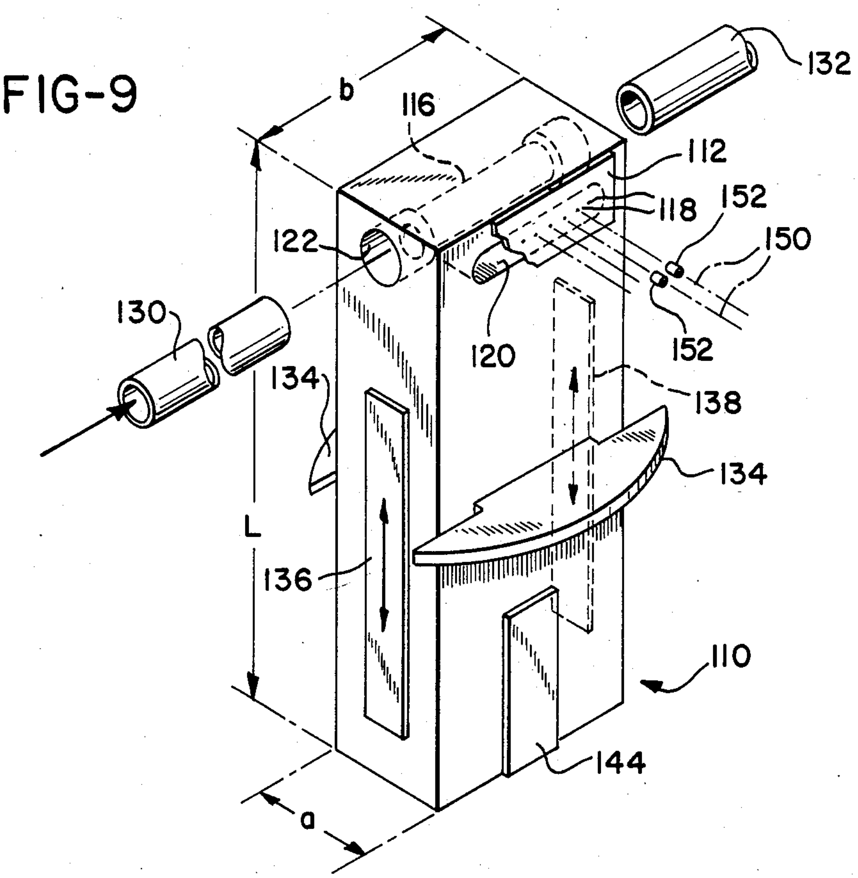
FIG. 9 is a perspective view of a third embodiment of the fluid jet print head of the present invention.

A third embodiment of the invention, as illustrated in FIG. 9, comprises a fluid jet print head 110 having a major dimension L and minor dimensions a and b corresponding to like designated dimensions for the embodiment of FIG. 1. Similarly, fluid jet print head 110 has a fluid receiving reservoir 116 provided with a supply opening 122 for reception of printing fluid from a fluid conduit 130. A fluid exit conduit 132 enables fluid removal from the print head.

Print head 110 also has an orifice plate 112 provided with a series of orifices 118 in communication with reservoir 116 but mounted differently than the corresponding orifice plate 12 of print head 10. As illustrated in FIG. 9, orifice plate 112 is mounted on a side face of print head 110 covering a sidewardly extending slot 120, so as to produce a series of jets 150 projecting in a direction perpendicular to the major dimension of the print head. These jets may be selectively charged by a series of electrodes 152, as is well known in the art.

Stimulation of jets 150 is achieved by applying stimulation driving signals of appropriate frequency to a pair of piezoelectric transducers 136, 138 bonded to the narrow sides of print head 110. The stimulation mechanism is the same as for the embodiment of FIG. 1. A stimulation driver (not illustrated) applies driving signals at near resonant frequency in common phase to both of transducers 136, 138. The transducers lengthen and shorten in unison, thereby applying shearing stresses to the surface of the print head. These stresses extend in a direction parallel to the major dimension of the print head and are converted to compression waves traveling in that direction. In order to minimize the power required for stimulation orifice plate 112 preferably should be located near the end of print head 110, as illustrated. Furthermore, the major dimension should again be substantially equal to an integral number of half wavelengths at the stimulation frequency, and the minor dimensions preferably should be less than about one-fourth the major dimension.

Print head 110 also may be provided with a pair of mounting flanges 134, 134 positioned for providing support at a nodal plane. A feedback transducer in the form of a strip of piezoelectric material 144 may be mounted on print head 110 as illustrated. Electrical connections to transducers 136, 138 and 144 may be made as shown in FIG. 7 for transducers 36, 38 and 44 respectively.

Figure 10:
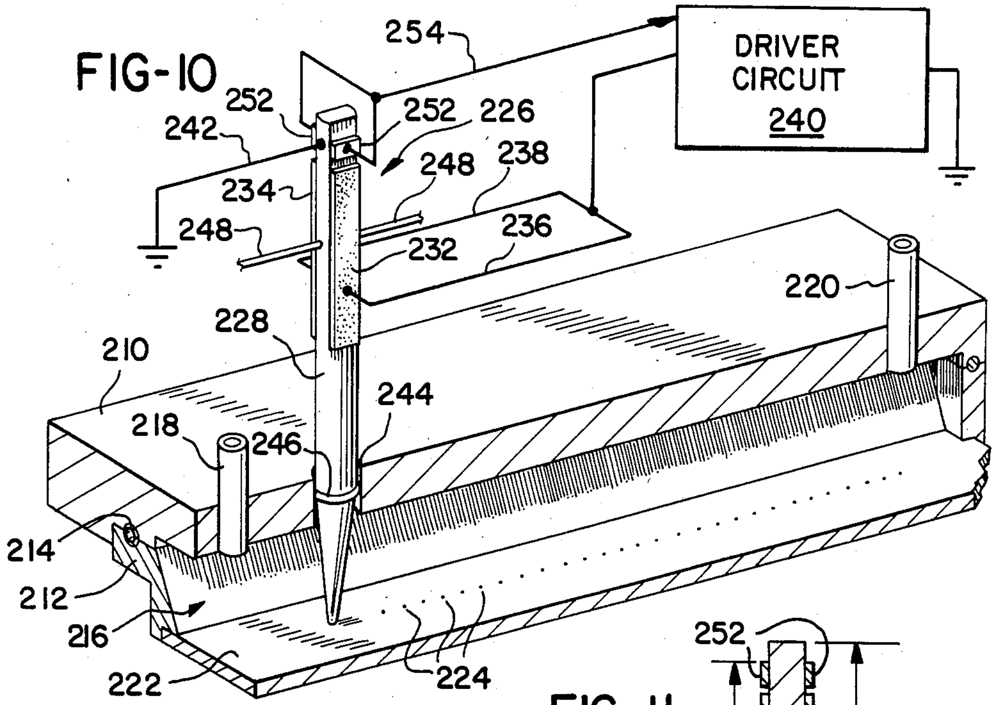
FIG. 10 is a perspective view of a fourth embodiment of the print head and stimulator of the present invention, with portions broken away to reveal interior structure.
Figure 12:
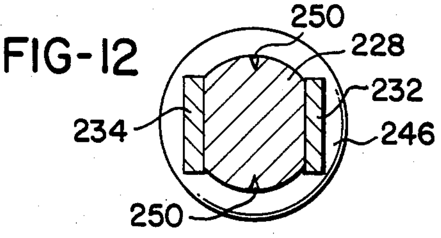
FIG. 12 is a sectional view taken generally along line 12—12 in FIG. 11.
Figure 11:
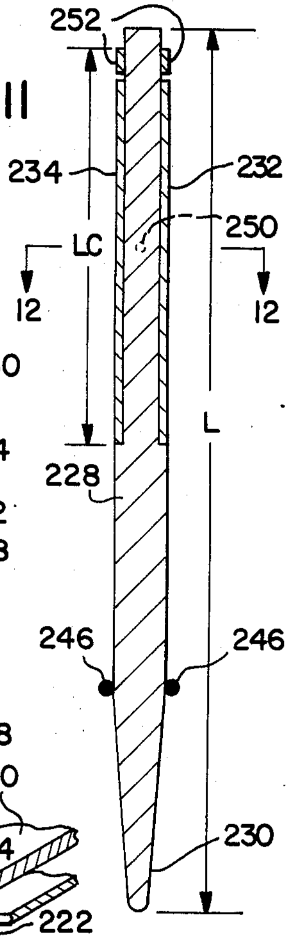
FIG. 11 is a sectional view of the stimulator of FIG. 10, taken through the center of the stimulator in a plane parallel to the axis of elongation thereof.

FIGS. 10, 11 and 12 illustrate a fluid jet print head and stimulator therefor constructed according to a fourth embodiment of the present invention. The print head includes a manifold means consisting of an upper manifold element 210, a lower manifold element 212, and a gasket 214 therebetween. The manifold means defines a fluid receiving reservoir 216 to which fluid may be applied under pressure via fluid inlet tube 218. Fluid may be removed from reservoir 216 through outlet tube 220 during cleaning operations or prior to extended periods of print head shutdown.

An orifice plate 222 is mounted on the manifold means. The plate is formed of a metal material and is relatively thin so as to be somewhat flexible. Orifice plate 222 is bonded to the manifold element 212, as for example by solder or by an adhesive, such that it closes and defines one wall of the reservoir 216. Orifice plate 222 defines a plurality of orifices 224 which are arranged in at least one row and which communicate with the reservoir 216 such that fluid in the reservoir 216 flows through the orifices 224 and emerges therefrom as fluid filaments. A stimulator means 226 mounted on contact with the orifice plate 222 vibrates the orifice plate to produce a series of bending waves which travel along the orifice plate 222 in a direction generally parallel to the row of orifices.

The stimulator means 226 includes a stimulator member 228, configured as a thin metal rod. The type of metal for the stimulator member 228 is selected to be compatible with the fluid supplied to reservoir 216. However, member 228 need not be made of metal, as other high acoustic Q solid materials such as glass or ceramic could be used. The stimulator member 228 is of a length L which is substantially equal to an integral number of half wavelengths of an acoustic wave traveling along the stimulator member 228. The distance L may be calculated by the formula set forth above in connection with the description of the embodiment of FIG. 1.

The end 230 of member 228 is tapered so that the member 228 contacts the orifice plate 222 in a localized region which is substantially a point. As is known, such point contact on the center line of the orifice plate 222 insures that bending waves of a first order are generated in the orifice plate 222, and that satisfactory stimulation is obtained.

The stimulator means 226 further includes piezoelectric crystal means, comprising piezoelectric crystals 232 and 234, which are mounted on the stimulator member 228. The crystals 232 and 234 each include a thin, electrically conductive layer on their outer surfaces to which conductors 236 and 238 are electrically connected. The inner surfaces of the crystals are in contact with and are grounded by the member 228. Member 228, in turn, may be grounded through orifice plate 222 or through ground conductor 240. The crystals 232 and 234 are configured such that they tend to compress or extend in a direction parallel to the axis of elongation of the member 228 when a fluctuating electrical potential is placed across the crystals. As a consequence, when an A.C. electrical drive signal is applied to lines 236 and 238 by driver circuit means 240, the crystals 232 and 234 produce acoustic waves in the stimulator member 228. The circuit 240 supplies an electrical drive signal at a frequency $f_o$, as specified above in relation to the length of the member 228.

In the embodiment illustrated in FIGS. 10–12, the stimulator member is substantially equal in length to one wavelength, that is, n is equal to 2. The member 228 extends into the manifold means through an opening 244 defined by element 210. The member 228 contacts the orifice plate 222 inside the reservoir 216. A seal, such as O-ring 246 surrounds the member 228, contacting the member 228 and element 210.

The stimulator means is mounted by tapered pins 248 which engage generally conical detents 250 in the sides of member 228. The pins 248 and detects 250 provide a pivotal mounting which restricts movement of member 228 vertically. As may be noted, the detents 250 are positioned $\frac{1}{4}\lambda$ from the upper end of the member 228, as seen in FIG. 11, while the O-ring 246 contacts the member 228 substantially $\frac{1}{4}\lambda$ from the lower end of the member 228. It will be appreciated that since crystals 232 and 234 extend above and below the detents 250 by substantially equal distances, pins 248 support the stimulator means in a nodal plane. Since the ring 246 contacts the member 228 $\frac{1}{2}\lambda$ below the pins 248, O-ring 246 also contacts the member 228 at a nodal plane. Thus substantial damping between the member 228 and the ring 246 does not occur. Additionally, the end of 230 of the member 228 is $\frac{1}{4}\lambda$ below a nodal plane and therefor at an anti-node, producing maximum amplitude mechanical stimulation for generation of the bending waves in the orifice plate 222. It will be understood that it is desirable to limit the length $L_c$ of the crystals 232 and 234 to $\frac{1}{2}\lambda$ or less. If the length of the crystals is greater than this, their vibratory motion will tend to counteract formation of standing waves in the member 228 and the production of nodal planes.

It will be appreciated that member 228 could be substantially longer than illustrated. The length of the member can be increased in multiples of $\frac{1}{2}$ wavelength with predictable harmonic progressions. In any event, however, it is desirable that the mounting for the member 228 be at a nodal plane and that sealing also occur at a nodal plane so that vibrational energy is not lost through the sealing or the mounting structures and that the member 228 contacts the orifice plate 222 at an anti-node.

An additional pair of piezoelectric crystals 252 may also be mounted on the member 228. Crystals 252 act as sensors and provide an electrical feedback signal on line 254 which is proportional in frequency and amplitude to the frequency and amplitude of the acoustic waves traveling through the member 228. The feedback signal on line 254 may be used by the driver circuit 240 to control the frequency and amplitude of the drive signal applied on lines 236 and 238.

Figure 13:
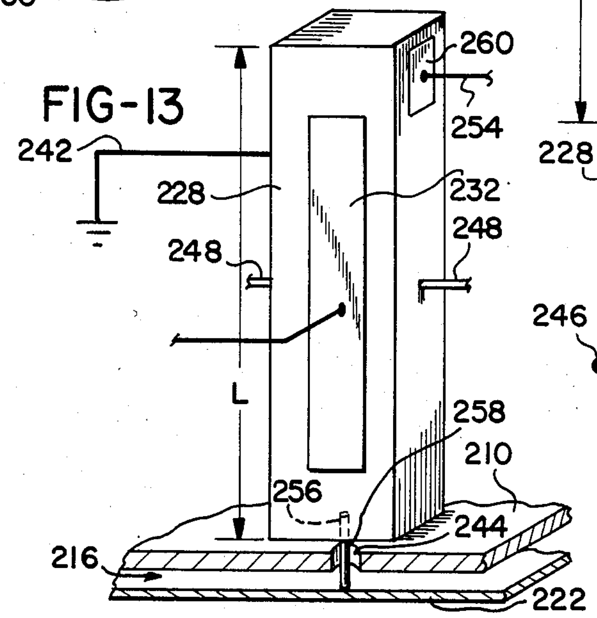
FIG. 13 is an enlarged perspective view of a fifth embodiment of the present invention, with portions broken away and in section.

FIG. 13 illustrates a fifth embodiment of the present invention in which the elements corresponding to the those in the fourth embodiment have been designated by the same numerals as those used in FIGS. 10–12. The stimulator member 228 of FIG. 13 is rectangular in cross-section and is substantially $\frac{1}{2}$ wavelength long, that is, L equals $\frac{1}{2}\lambda$. Piezoelectric crystals 232 and 234 (not shown) are mounted on opposing faces of the member 228.

A vibration transmission pin 256 is mounted on one end of the member and is preferably pressed into a hole in the end of the member or is machined on the end of the member. The pin 256 directly transmits the movement of the lower end of the member 228 to the orifice plate 222. The pin 256 has a cross-sectional area, taken in a plane substantially perpendicular to the direction of the elongation of member 228, which is substantially less than the cross-sectional area of the member. Thus, the acoustic waves in the member 228 do not pass through pin 256, but rather are reflected back toward the nodal plane which passes through pins 248. The length of pin 256 is not related to the frequency of operation of the stimulator means, since the pin acts merely as a means of transmitting the vibrations from the anti-node at the end of member 228 to the plate 222. The pin 256 passes through opening 244 and is engaged by a small diameter O-ring 258 which prevents leakage of fluid from reservoir 216. Preferably, an automatic gain control in the driver circuit allows the stimulation amplitude to be held constant, regardless of the degree of damping provided by O-ring 258.

A single piezoelectric transducer 260 is mounted on a side of the member 228 other than the sides upon which the piezoelectric transducers 232 and 234 are mounted. Transducer 260 provides a feedback signal on line 254 which may be used by a driver circuit to control operation of the stimulator.

It will be appreciated that in each of the above described embodiments of the invention there are provided surface mounted transducers which induce shear stresses therebelow. These shear stresses are converted to compression waves which in turn are coupled into the fluid filaments.

While the method and the forms of apparatus herein described constitute preferred embodiments of this invention, it is to be understood that the invention is not limited to such precise method or forms of apparatus, and that changes may be made therein without departing from the scope of the invention which is defined in the appended claims.

What is claimed is:

1. A fluid jet print head for generating at least one stream of drops, comprising:

an elongated print head body, the length of said body between first and second ends thereof being substantially greater than its other dimensions, said body defining a fluid receiving reservoir in said first end thereof and at least one orifice, communicating with said fluid receiving reservoir, means for supplying fluid to said reservoir under pressure such that fluid emerges from said orifice to form a fluid stream, support means for engaging said print head body intermediate said first and second ends, and transducer means, mounted on the exterior of said body and extending a substantial distance along said body in the direction of elongation thereof, said transducer means being responsive to an electrical driving signal for changing dimension in the direction of elongation of said body thereby causing mechanical vibration of said body, and break up of said fluid stream into a stream of drops and comprising a pair of piezoelectric transducers bonded to opposite sides of said body and extending in the direction of elongation from points adjacent said first end to points adjacent said second end to provide alternate lengthening and contraction of said elongated print head body in the direction of elongation thereof.

2. The fluid jet print head of claim 1 in which said transducer means further comprises means for electrically connecting said pair of piezoelectric transducers in parallel.

3. The fluid jet print head of claim 2 in which said piezoelectric transducers are connected to elongate and contract in phase.

4. The fluid jet print head of claim 3 in which said support means engages said print head body substantially intermediate and equidistant from said first and second ends thereof.

5. The fluid jet print head of claim 2 in which said piezoelectric transducers are connected to elongate and contract out of phase, thereby producing flexure of said print head body.

6. The fluid jet print head of claim 5 in which said support means pivotally engages said print head body at flexure nodes.

7. The fluid jet print head of claim 1 in which said support means comprises a pair of mounting flanges, each integrally formed with said print head body, and being relatively thin, said flanges extending from said elongated print head body on opposite sides thereof and substantially equidistant from said first and second ends of said body such that said flanges support said body along a nodal plane.

8. The fluid jet print head of claim 1 in which said support means comprises a pair of support screws which engage said body at opposite sides thereof at points substantially equidistant from said first and second ends of said print head body.

9. The fluid jet print head of claim 1 in which said print head body includes means defining a slot in the first end thereof, and orifice plate means, attached to said means defining a slot, and forming said fluid receiving reservoir therewith.

10. The fluid jet print head of claim 9 in which said orifice plate means defines a plurality of orifices for production of a plurality of drop streams.

11. The fluid jet print head of claim 9 in which said print head further defines a fluid outlet opening communicating with said slot.

12. The fluid jet print head of claim 11 further comprising fluid conduit lines connected to said fluid supply opening and said fluid outlet opening, said fluid conduit lines being formed of a material having a substantially different vibrational impedance than said print head body, whereby said conduit lines do not provide a substantial power loss.

13. The fluid jet print head of claim 12 in which said fluid conduit lines are made of a polymer material.

14. The fluid jet print head of claim 1, further comprising monitor transducer means, mounted on the exterior of said body and providing an electrical monitor signal in response to dimensional changes of said body.

15. The fluid jet print head of claim 3 further comprising means for applying an electrical driving signal of a frequency substantially equal to $f_o$, where $$f_o = C/2L,$$

L is the dimension of said body in the direction of elongation, and C is the speed of sound through said body, whereby said fluid jet print head may be driven at a frequency approximately its mechanical resonant frequency.

16. The fluid jet print head of claim 1 further comprising monitor transducer means, mounted on the exterior of said body and providing an electrical monitor signal in response to dimensional changes of said body, and means, responsive to said monitor transducer means, for applying an electrical driving signal to said transducer means of an amplitude dependent upon said electrical monitor signal.

17. The fluid jet print head of claim 5 further comprising means for applying an electrical driving signal of a frequency substantially equal to $f_o$, where $$f_o = 9\pi CK/8L^2,$$

L is the dimension of said body in the direction of elongation, C is the speed of sound through said body, and K is the radius of gyration of said body.

18. A method for stimulating the break up of a fluid stream emanating from at least one orifice communicating with a fluid reservoir in a fluid jet print head, comprising:

(a) providing an elongated print head which defines the reservoir and the orifice at one end thereof, (b) applying fluid under pressure to said reservoir so as to produce fluid flow through the orifice, (c) supporting said print head at points in a plane substantially equidistant from the ends of the elongated print head and normal to the direction of elongation of the print head, and (d) by means of piezoelectric transducers bonded to the exterior thereof, alternately elongating and contracting said print head substantially at the resonant frequency of said print head, whereby said print head is supported in a nodal plane and said stream is stimulated to break up into drops.

19. The method of claim 18 in which the resonant frequency of the print head is substantially equal to the resonant frequency of the fluid stream.

20. A method for stimulating the break up of a fluid stream emanating from at least one orifice communicating with a fluid reservoir in a fluid jet print head, comprising:

(a) providing an elongated print head which defines the reservoir and the orifice at one end thereof, (b) applying fluid under pressure to said reservoir so as to produce fluid flow through the orifice, and (c) vibrating said print head in its first flexure mode substantially at the resonant flexure frequency of said print head, while supporting said print head at nodal points such that said stream is stimulated to break up into drops; said vibrating being accomplished by exciting a pair of piezoelectric transducers bonded to the exterior of said print head in such a manner as to produce surface shearing stresses therein.

21. In a jet drop printer comprising a print head provided with a fluid receiving reservoir, an orifice plate provided with a plurality of orifices communicating with said reservoir, fluid supply means for supplying a printing fluid to said reservoir under pressure such that fluid emerges from said orifices as a plurality of streams, transducer means vibrating at a frequency $f_o$ for causing each of said streams to break up into drops at said frequency, and means for controlling the flight trajectories of said drops; the improvement wherein said print head has a major dimension substantially equal to an integral number of half wavelengths of head vibration at frequency $f_o$ and two other minor dimensions each substantially shorter than a half of one of said wavelengths; said transducer means comprising a pair of thin elongated strips of piezoelectric material extending in the direction of said major dimension and bonded to opposite surfaces of said print head so that vibrating elongation of said strips at said frequency induces corresponding shear stresses in said surfaces.

22. The improvement of claim 21 wherein said orifice plate is mounted upon a face of said print head extending perpendicular to said major dimension.

23. The improvement of claim 21 wherein said orifice plate is mounted upon a face of said print head extending parallel to said major dimension.

24. The improvement of claim 21 wherein said major dimension is substantially equal to:

$$C/2f_o$$

where C is the speed of sound in said print head.

25. The improvement of claim 24 wherein said minor dimensions are less than about one-fourth of said major dimension.

26. The improvement of claim 25 wherein said print head is supported by support means attached thereto at a nodal plane.

27. The improvement of claim 25 wherein said print head further comprises monitor transducer means mounted on the exterior thereof for providing a feedback signal indicating the amplitude of vibration of said print head.

28. A fluid jet print head for generating a plurality of in-phase droplet streams, said print head comprising:

an elongated print head body, the length of said body between first and second ends thereof being substantially greater than its other dimensions so as to define an axis of longitudinal vibration, said body defining a fluid receiving reservoir proximate said first end thereof;

an orifice plate including a plurality of coplanar orifices, said plate being coupled to said print head body proximate said first end in a manner such that said orifice plane is either substantially normal to, or substantially parallel to the longitudinal vibrational axis of said body; and a pair of elongated transducers, mounted on opposite exterior sides of said body and extending generally symmetrically, a substantial distance along the length of said body, said transducer means being constructed and oriented to change dimension, in said direction of print body elongation, in response to applied electrical potentials;

whereby application of in-phase periodic potential signals to said transducer means will effect a longitudinal vibration of said print head body on said axis and move said orifices in their substantially coplanar relation.

29. The invention defined in claim 28 wherein said print head body is constructed with: (i) a dimension L in the direction of its elongation and (ii) a generally homogeneous composition having a speed of sound C therethrough, such that the fundamental longitudinal mode resonant frequency $f_o$ of the print head body ($f_o=C/2L$) is approximately equal to the predetermined nominal droplet frequency for its printing apparatus.

30. For use in continuous fluid jet printing apparatus of the type utilizing a plurality of fluid drop-streams of predetermined nominal drop frequency, an improved drop-stream generator comprising:

a print head body having a length between first and second ends that is substantially greater than its other dimensions and defining a fluid inlet and a fluid reservoir proximate said first end, said print head body being constructed with a predetermined length L and with a predetermined generally homogeneous composition, having a speed of sound C therethrough, so that it has a resonant frequency $f_o$ ($f_o=C/2L$) on its longitudinal axis that is approximately equal to such predetermined nominal drop frequency;

an orifice plate coupled to said print head body in communicating with said reservoir, said plate including a plurality of coplanar orifices and being located with the orifice plate either subsantially normal to, or substantially parallel to, said longitudinal axis of said print head body and transducer means, mounted on the exterior of said print head body, for vibrating said print head body on its longitudinal axis;

whereby application of drive signals of the desired drop frequency to said transducer means will effect substantially resonant longitudinal mode vibration of said print head body and cause stimulating movement of said orifice plate with its orifices in said coplanar relation;

said transducer means comprising a pair of elongated piezoelectric members extending, in symmetrical relation along opposite sides of said print head body, said members being constructed and oriented to change dimension in the direction of print head body elongation in response to an applied drive signal.

31. In continuous fluid jet printing apparatus an improved drop generation system for producing a plurality of in-phase droplet streams of predetermined drop frequency, said system comprising:

a print head body having a longitudinal axis and length, between first and second ends, that is substantially greater than its other dimensions and defining a fluid inlet and a fluid reservoir proximate said first end;

an orifice plate coupled to said print head body proximate and including a plurality of coplanar orifices in fluid communication with said reservoir, the plane of such orifices being either substantially normal to, or substantially parallel to, the longitudinal axis of said print head body; and a pair of piezoelectric members, mounted on the exterior of said body and extending symmetrically along opposing surfaces of said body in the direction of print head body elongation, said transducer means being constructed and oriented to change dimension in said direction of elongation in response to applied electrical potential;

means for applying in-phase, periodic potential signals to said piezoelectric members to effect a longitudinal mode vibration of said print head body at said predetermined drop frequency, whereby said orifice plate will move at such frequency, with said orifices maintaining said substantially coplanar relation, and to effect formation of such in-phase droplet streams of said predetermined drop frequency.

32. The invention defined in claim 31 wherein said print head body is constrcuted (i) with a dimension L in the direction of its elongation and (ii) with a generally homogeneous composition, having a speed of sound C therethrough, such that the longitudinal mode, mechanical resonant frequency $f_o$ of the print head body ($f_o=C/2L$) is approximately equal to a nominal droplet frequency of the printing apparatus.

33. In a fluid jet print head for generating a plurality of droplet streams, the improvement comprising:

an elongated stimulator member, the length of said member between first and second ends thereof being substantially greater than its other dimensions; and a pair of transducer means, mounted on the opposite exterior sides of said stimulator member and extending in opposing relation a substantial distance in the direction of elongation thereof, said transducer means being responsive to an electrical driving signal for applying surface shearing stresses to said stimulator member in said direction.

34. The invention defined in claim 33 wherein said stimulator member is constructed (i) with a dimension L in the direction of its elongation and (ii) with a generally homogeneous composition, having a speed of sound C therethrough, such that the longitudinal mode, mechanical resonant frequency $f_o$ of the stimulator member ($f_o=C/2L$) is approximately equal to a nominal droplet frequency.

35. In a fluid jet print head comprising:

a print head body provided with a cavity defining a fluid receiving reservoir, an orifice plate mounted on said print head body and provided with at least one orifice in communication with said cavity, means for supplying fluid to said reservoir under pressure such that fluid emerges from said orifice to form a fluid stream, and stimulation means coupled to said orifice plate for causing mechanical vibration thereof at a frequency $f_o$ and inducing breakup of said fluid stream into a stream of drops at said frequency the improvement wherein said stimulation means comprises a high acoustic Q solid member having a major dimension substantially equal to an integral number of half wavelengths of vibration at said frequency and two other minor dimensions each substantially shorter than a half of one of said wavelengths, and a pair of elongated strips of piezoelectric material extending in the direction of said major dimension and bonded to opposite surfaces of said high Q member so that vibrating elongation of said strips at said frequency induces corresponding shear stresses in said surfaces and consequential vibration of said orifice plate.

36. The improvement of claim 35 wherein said high Q member comprises a rod-like member supported for localized contact against said orifice plate.

37. The improvement of claim 35 wherein said high Q member comprises support structure integrally associated with said print head body.

38. The improvement of claim 35, further comprising monitor transducer means, mounted on the exterior of said member and providing an electrical monitor signal in response to dimensional changes of said member.

39. The improvement of claim 38, further comprising means responsive to said monitor transducer means for applying an electrical driving signal to said stimulation means of an amplitude dependent upon said electrical monitor signal.

* * * * *